(12) United States Patent
Kwak

(10) Patent No.: US 8,050,003 B2
(45) Date of Patent: Nov. 1, 2011

(54) ELECTROSTATIC DISCHARGE PROTECTION CIRCUIT HAVING A REDUCED SIZE AND LOWER OPERATING VOLTAGE

(75) Inventor: Kook Whee Kwak, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 575 days.

(21) Appl. No.: 12/062,722

(22) Filed: Apr. 4, 2008

(65) Prior Publication Data
US 2008/0247104 A1 Oct. 9, 2008

(30) Foreign Application Priority Data
Apr. 5, 2007 (KR) .................... 10-2007-0033905

(51) Int. Cl.
*H02H 9/00* (2006.01)
(52) U.S. Cl. .......................................................... 361/56
(58) Field of Classification Search .............. 361/52, 361/56, 11
See application file for complete search history.

(56) References Cited

U.S. PATENT DOCUMENTS

| 6,724,603 | B2 | 4/2004 | Miller et al. | |
| 7,593,202 | B2* | 9/2009 | Khazhinsky et al. | 361/56 |
| 2004/0027742 | A1* | 2/2004 | Miller et al. | 361/52 |
| 2007/0195472 | A1* | 8/2007 | Kwak et al. | 361/56 |
| 2009/0323237 | A1* | 12/2009 | Kwak | 361/56 |

FOREIGN PATENT DOCUMENTS

| KR | 0170896 | 3/1999 |
| KR | 1020050026915 | 3/2005 |

OTHER PUBLICATIONS

MC Jung et al., ESD Protection Circuit with an Improved ESD Capability for Input or Output Circuit Protection, (No month) 2005 IEEE, pp. 468-471.*
Michael Stockringer, et al; "Boosted and Distributed Rail Clamp Networks for ESD Protection in Advanced CMOS Technologies", Microelectronics and Reliability vol. 45, Issue 2, Feb. 2005, pp. 211-222.

* cited by examiner

*Primary Examiner* — Rexford Barnie
*Assistant Examiner* — Angela Brooks
(74) *Attorney, Agent, or Firm* — Ladas & Parry LLP

(57) ABSTRACT

The present invention discloses an electrostatic discharge protection circuit. The electrostatic discharge protection circuit of the present invention includes a transfer unit that transfers electrostaticity from at least one of a plurality of input/output pads to a boost bus line, a trigger unit that responds to the electrostaticity transferred via the boost bus line to detect a trigger voltage and apply it to a trigger bus line, and a plurality of clamp units that are connected between the input/output pads and an internal circuit. The clamp units are triggered by the trigger voltage of the trigger unit to discharge electrostaticity of the input/output pads to a first or second power supply voltage line, thereby safely protecting the internal circuit from electrostatic damage and lowering the operating voltage of the clamp unit with minimum costs without increasing an area of the electrostatic discharge protective circuit within a semiconductor integrated circuit.

11 Claims, 5 Drawing Sheets

ELECTROSTATIC DISCHARGE PROTECTION CIRCUIT HAVING A REDUCED SIZE AND LOWER OPERATING VOLTAGE

CROSS-REFERENCE TO RELATED APPLICATIONS

The present application claims priority to Korean patent application number 10-2007-0033905 filed on Apr. 5, 2007, which is incorporated herein by reference in its entirety.

BACKGROUND OF THE INVENTION

The present invention relates to a semiconductor integrated circuit, and more specifically to an electrostatic discharge protection circuit that protects an internal circuit from damage due to electrostatic discharge (ESD).

Electrostaticity is one of the important factors that have an effect on reliability of a semiconductor integrated circuit. Electrostaticity can be charged in a human body and/or a machine. When the human body and/or a machine charged with electrostaticity contacts a semiconductor integrated circuit, the electrostaticity is discharged to the internal circuit via an input/output pad through an external pin of the semiconductor integrated circuit to damage the internal circuit. Therefore, most semiconductor integrated circuits include an electrostatic discharge protective circuit between the input/output pad and the internal circuit in order to protect the internal circuit from damage resulting from the electrostatic discharge.

Referring to FIG. 1, a conventional electrostatic discharge protective circuit includes transfer units 106 and 108 for every input/output pad 100, a trigger unit 110, a discharge unit 120, and a clamp unit 130 to protect a circuit (for example, an input buffer 140) from the damage of electrostatic discharge.

When a positive potential electrostatic current is generated at an input/output pad 100 from a ground voltage terminal 104, the transfer unit 106 induces electrostatic current to a power supply voltage bus line VDD_BL through a diode D1.

When a drain voltage of an NMOS transistor N1 is raised due to the electrostatic current induced to the power supply voltage bus line VDD_BL and exceeds an electrostatic discharge triggering voltage (ESD triggering voltage), the discharge unit 120 discharges the electrostatic current induced to the power supply voltage bus line VDD_BL to the ground voltage terminal 104 through a drain-substrate-source of the NMOS transistor N1.

At this time, the electrostatic discharge triggering voltage of the NMOS transistor N1 depends on the size of the NMOS transistor N1 and the gate voltage. The higher the gate voltage and the larger the size of the NMOS transistor N1, the lower the electrostatic discharge triggering voltage becomes, making it possible to rapidly discharge the electrostaticity.

Accordingly, the trigger unit 110 induces the gate voltage of the NMOS transistor N1 so that the discharge unit 120 is turned-on at low voltage. Specifically, the trigger unit 110 responds to a rapid signaling rising time characteristic of the electrostatic current so that alternating current induced to the power supply voltage bus line VDD_BL flows to a resistor R1 through a capacitor C1 to generate a voltage drop across the resistor R1. The voltage drop allows the same voltage as the power supply voltage bus VDD_BL to be applied to a gate of the NMOS transistor N1 by an inverter IV1. As a result, the electrostatic discharge triggering voltage of the NMOS transistor N1 is lowered, making it possible to more rapidly discharge the electrostaticity.

Meanwhile, the clamp unit 130 discharges the electrostatic current applied to an input buffer 140 to the ground voltage bus line VSS_BL so that the input buffer 140 can be protected from the electrostatic current.

However, the representative conventional electrostatic discharge protective circuit shown in FIG. 1 includes the trigger unit 110 for every input/output pad 100 in addition to the discharge unit 120 that is a direct path of the electrostatic discharge, thereby increasing an area occupied by the electrostatic discharge protective circuit.

Also, as semiconductor technology develops, gate-insulating films of MOS transistors P1 and N2, constituting the input buffer 140, are becoming thinner. In this situation, when the gate insulating films' breakdown voltage of the MOS transistors P1 and N2 constituting the input buffer 140 is lower than the electrostatic operating voltage of the clamp unit 130, there is a problem in that the gate insulating film may break down before the clamp unit 130 performs the discharge operation.

Recently, U.S. Pat. No. 6,724,603 suggested an electrostatic discharge protective circuit including one trigger unit for every plurality of input/output pads in order to reduce the area of the electrostatic discharge protective circuit as seen in FIG. 2.

Referring to FIG. 2, another conventional electrostatic discharge protective circuit includes transfer units 206, 208, 209, discharge units 220, and one trigger unit 210 for every plurality of input/output pads 200. The trigger unit sends triggering signals to the plurality of discharge units 220 through a trigger bus line TRG_BL.

When a positive potential electrostatic signal is generated at least one input/output pad 200 corresponding to a ground voltage terminal 204, the transfer unit 206 induces electrostatic current to a power supply voltage bus line VDD_BL and at the same time, the transfer unit 209 induces the electrostatic current to a boost bus line BST_BL.

The trigger unit 210 responds to the alternating current of the electrostaticity flowed into the boost bus line BST_BL, forms a current path between the boost bus line BST_BL and the ground power supply bus line VSS_BL, and applies the output trigger voltage from the current path to the plurality of discharge units 220 through the trigger bus line TRG_BL.

At least one discharge unit 220 is triggered according to a state of the trigger bus line TRG_BL, thereby discharging the electrostatic current induced to the power supply voltage bus line VDD_BL to the ground voltage terminal 204.

As such, the conventional electrostatic discharge protective circuit of FIG. 2 includes one trigger unit for every plurality of input/output pads making it possible to greatly reduce a required area for the electrostatic discharge protective circuit within the semiconductor integrated circuit as compared to the conventional electrostatic discharge protective circuit of FIG. 1 including a trigger unit for every input/output pad.

However, the conventional electrostatic discharge protective circuit of FIG. 2 still suffers from weak protection of the input buffer from the electrostaticity generated from the input/output pad like that of the conventional electrostatic discharge protective circuit of FIG. 1.

SUMMARY OF THE INVENTION

Therefore, the present invention provides an electrostatic discharge protective circuit that safely protects an internal circuit from electrostatic damage without increasing an area of an electrostatic discharge protective circuit within a semiconductor integrated circuit.

The present invention also provides an electrostatic discharge protective circuit that protects an internal circuit from electrostatic damage by including a clamp unit for lowering operating voltage at low costs.

An embodiment of the present invention provides an electrostatic discharge protective circuit comprising: a transfer unit that transfers electrostaticity from at least one of a plurality of input/output pads to a boost bus line; a trigger unit that responds to the electrostaticity transferred via the boost bus line to detect trigger voltage and apply it to a trigger bus line; and a plurality of clamp units that are connected between the input/output pads and an internal circuit and are triggered by the trigger voltage to discharge the electrostaticity of the input/output pads to a first or second power supply voltage line.

Preferably, each transfer unit may be provided for at least every one input/output pad.

The transfer unit comprises a diode whose anode is connected to the input/output pad and cathode is connected to the boost bus line.

Preferably, the first voltage bus line may be a power supply voltage bus line and the second voltage bus line may be a ground voltage bus line.

The trigger unit comprises a detector that responds to alternating current of the electrostaticity and detects the trigger voltage with the electrostatic voltage; and a switch unit that senses the trigger voltage transferred to the trigger bus line and disconnects the boost bus line and the first voltage bus line.

The detector comprises a resistor and a capacitor serially connected between the boost bus line and the second voltage bus line and preferably, the trigger voltage can be generated at a node connecting the resistor and the capacitor.

The detector further comprises a buffer that is connected between the node and the trigger bus line and responds to alternating current to invert a voltage difference generated across the resistor detected at the node to a voltage level of the boost bus line and to transfer it to the trigger bus line.

The buffer comprises an inverter.

The switch unit comprises a PMOS transistor that responds to the trigger voltage and disconnects the boost bus line and the first voltage bus line.

Preferably, each of the plurality of clamp units may be provided every at least one input/output pad.

Each of the clamp units comprises a first clamp that responds to the trigger voltage applied to the trigger bus line and discharges the electrostaticity of the input/output pad to the first power supply voltage line; and a second clamp that responds to the trigger voltage applied to the trigger bus line and discharges the electrostaticity of the input/output pad to the second power supply voltage line.

At this time, each of the first and second clamps comprises an NMOS transistor whose gate is connected to the trigger bus line and one terminal is connected to the internal circuit.

Preferably, each of the clamps further comprises a resistor that drops the electrostatic voltage of the input/output pad and transfers it to the internal circuit.

There is provided another electrostatic discharge protective circuit comprising: a trigger unit that responds to electrostaticity transferred via a first power supply voltage bus line from at least one of a plurality of input/output pads to detect trigger voltage and transfer it to a trigger bus line; and a plurality of clamp units that is connected between the input/output pad and an internal circuit and is triggered by the trigger voltage to discharge the electrostaticity of the input/output pad to the first power supply voltage bus line or a second power supply voltage bus line.

At this time, the first voltage bus line may be a power supply voltage bus line and the second voltage bus line may be a ground voltage bus line.

Preferably, the trigger unit comprises a resistor and a capacitor serially connected between the first voltage bus line and the second voltage bus line and responds to alternating current of the electrostaticity transferred to the first voltage bus line to generate the trigger voltage with dropped electrostatic voltage at a node connecting the resistor and the capacitor.

The trigger unit further comprises a buffer that is connected between the node and the trigger bus line and responds to alternating current to invert a voltage difference generated across the resistor detected at the node to a voltage level of the boost bus line and to transfer it to the trigger bus line.

The buffer comprises an inverter.

Each of the plurality of clamps may be provided every the at least one input/output pad.

Each of the clamp units comprises a first clamp that responds to the trigger voltage applied to the trigger bus line and discharges the electrostaticity of the input/output pad to the first power supply voltage line; and a second clamp that responds to the trigger voltage applied to the trigger bus line and discharges the electrostaticity of the input/output pad to the second power supply voltage line.

At this time, each of the first and second clamps comprises an NMOS transistor whose gate is connected to the trigger bus line and one terminal is connected to the internal circuit.

Each of the clamps further comprises a resistor that drops the electrostatic voltage of the input/output pad and transfers it to the internal circuit.

DESCRIPTION OF SPECIFIC EMBODIMENTS

Hereinafter, preferred embodiments of the present invention will be described in detail with reference to the accompanying drawings.

The present invention discloses an electrostatic discharge protective circuit that includes a discharge unit and a clamp unit corresponding to at least one input/output pad, respectively and trigger units corresponding to at least two input/output pads to improve layout efficiency and supplies a trigger voltage output from the trigger unit to the discharge unit and the clamp unit corresponding to the input/output pad, respectively, thereby safely protecting an internal circuit from electrostaticity.

Figure 1:
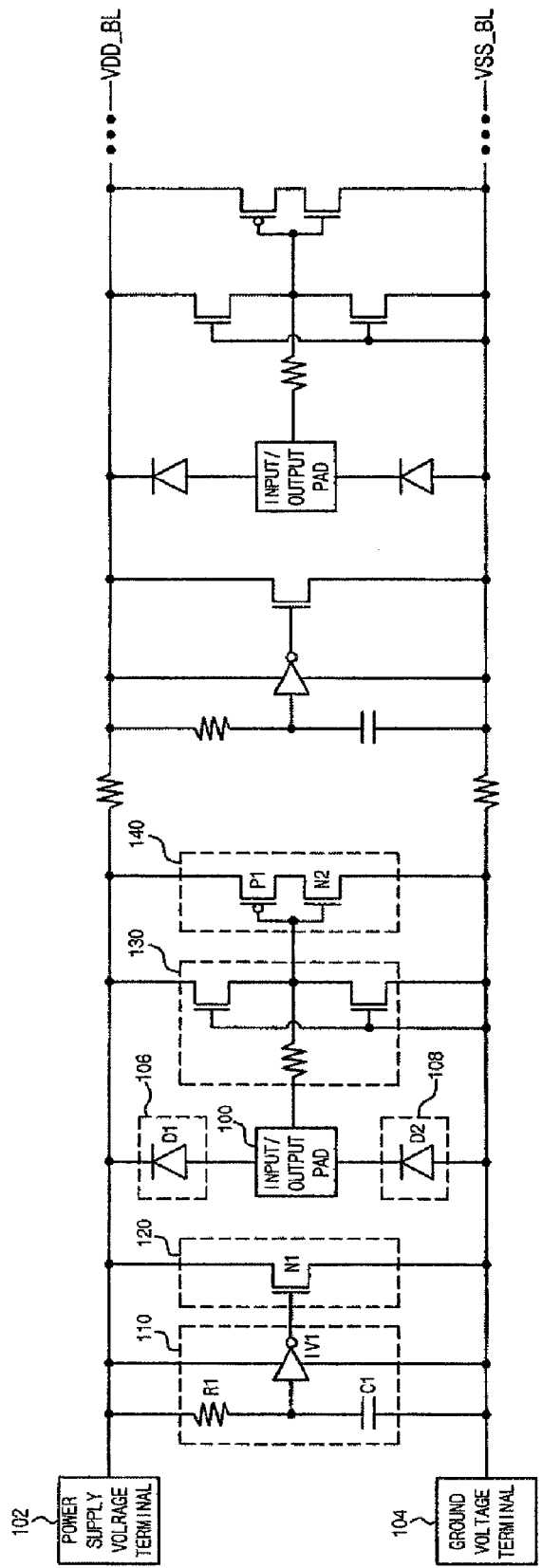
FIG. 1 is a circuit diagram showing an electrostatic discharge protective circuit according to the conventional art.
Figure 2:
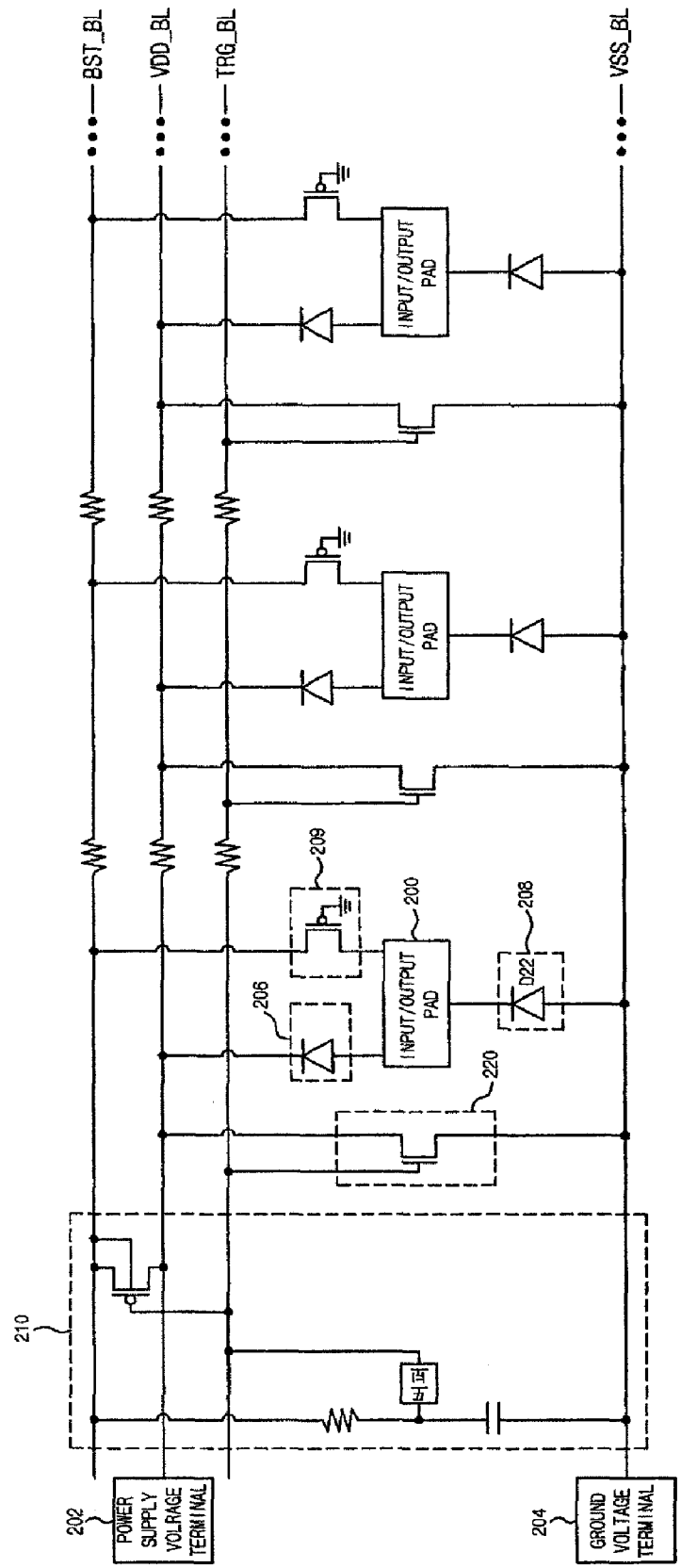
FIG. 2 is a circuit diagram showing another electrostatic discharge protective circuit according to the conventional art.
Figure 3:
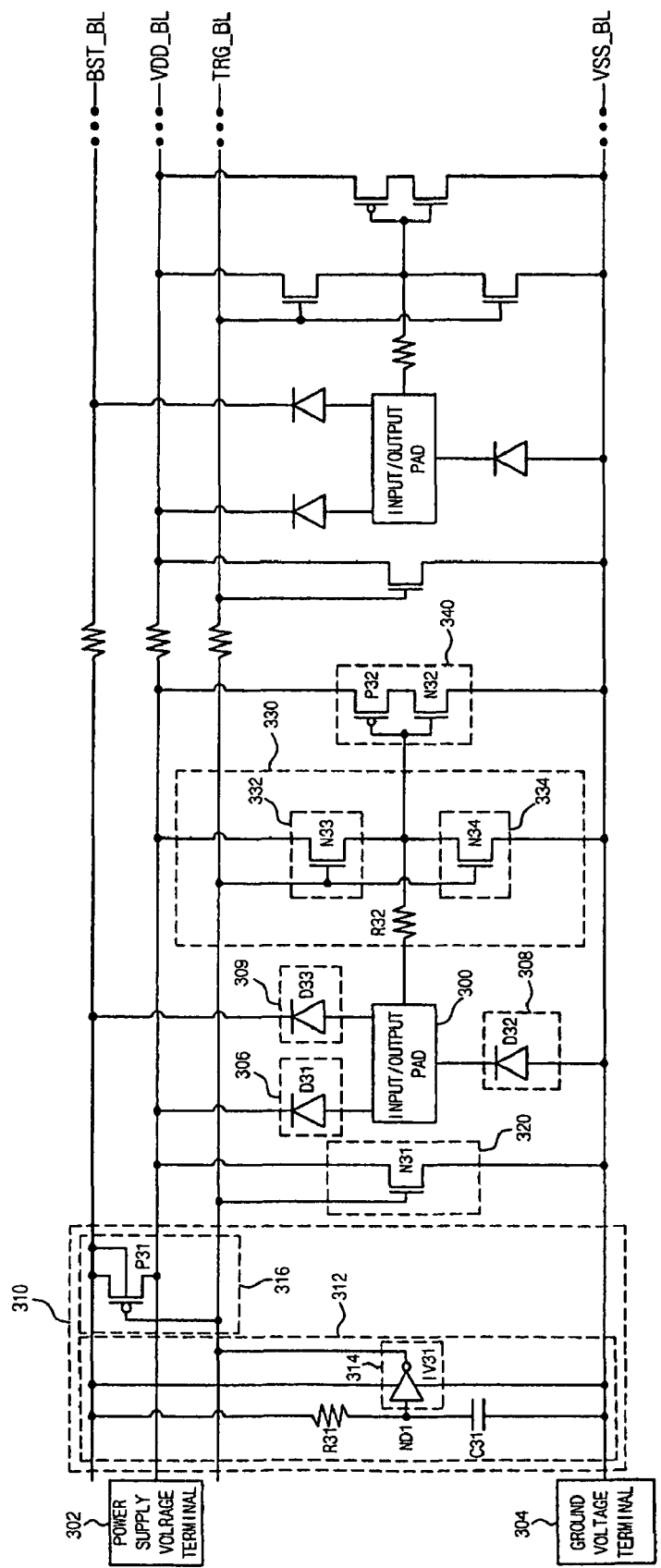
FIG. 3 is a circuit diagram showing an electrostatic discharge protective circuit according to a first embodiment of the present invention.

An electrostatic discharge protective circuit according to a first embodiment of the present invention, as shown in FIG. 3, preferably includes transfer units 306, 308, and 309 that have a one-to-one correspondence relation between each input/output pad 300 and an internal circuit (hereinafter, referred to as an input buffer 340), a discharge unit 320, and a clamp unit 330 and trigger units 310 corresponding to at least two input/output pads 300.

In FIG. 3, only one trigger unit 310 is shown, but in some cases, a plurality of trigger units 310 may be used. Also, each discharge unit 320 is arranged for every one input/output pad 300 or may also be arranged for at least every two input/output pads 300.

Specifically, the transfer unit 306 may include a diode D31 that is connected between the input/output pad 300 and the power supply voltage bus line VDD_BL to induce electrostatic current flowed in the input/output pad 300 to the power supply voltage bus line VDD_BL.

The anode of the diode D31 is connected to the input/output pad 300 and the cathode of the diode D31 is connected to the power supply voltage bus line VDD_BL.

The transfer unit 308 may include a diode D32 that is connected between the input/output pad 300 and the ground voltage bus line VSS_BL to induce the electrostaticity flowed in the input/output pad 300 to the power supply voltage bus line VDD_BL.

The anode of the diode D32 is connected with the ground voltage bus line VSS_BL and the cathode of the diode D32 is connected with the input/output pad 300.

The transfer unit 309 may include a diode D33 that is connected between the input/output pad 300 and the boost bus line BST_BL to induce electrostaticity flowed in the input/output pad 300 to the boost bus line BST_BL.

The anode of the diode D33 is connected with the input/output pad 300 and the cathode of the diode D33 is connected with the boost bus line BST_BL.

FIG. 3 shows the transfer unit 309 as the diode D33, but the transfer unit 309 may include various devices that perform a switching role for inducing the electrostaticity flowed into the input/output pad 300 to the boost bus line BST_BL.

In FIG. 3, the trigger unit 310 includes a detector 312 and a switch unit 316.

The detector 312 may include a resistor R31, a capacitor C31, and a buffer 314 that respond to alternating current of electrostaticity transferred to the boost bus line BST_BL by the transfer unit 309 to form a current path between a trigger bus line TRG_BL and the ground voltage bus line VSS_BL, thereby detecting the generated voltage drop to transfer it to the trigger bus line TRG_BL.

The resistor R31 is connected between the boost bus line BST_BL and a node ND1, and the capacitor C31 is connected between the node ND1 and the ground voltage bus line VSS_BL. The buffer 314 is connected between the node ND1 and the trigger bus line TRG_BL and responds to alternating current to invert a voltage difference generated across the resistor R31 detected at the node ND1 to the boost bus line BST_BL voltage level and to transfer it to the trigger bus line TRG_BL. Herein, the buffer 314 may include an inverter IV31.

The switch unit 316 includes a PMOS transistor P31 that responds to the voltage of the trigger bus line TRG_BL to connect or disconnect the power supply voltage bus line VDD_BL and the boost bus line BST_BL.

One terminal of the PMOS transistor P31 is connected to the boost bus line BST_BL and the other terminal of the PMOS transistor P31 is connected to the power supply voltage bus line VDD_BL. The gate of the PMOS transistor P31 is connected to the trigger bus line TRG_BL.

In other words, when electrostaticity is not passed from the input/output pad 300, the switch unit 316 turns on the PMOS transistor P31 to connect the power supply bus line VDD_BL and the boost bus line BST_BL since the voltage of the trigger bus line TRG_BL is at a low state. On the other hand, when electrostaticity is passed from the input/output pad 300, the switch unit 316 turns off the PMOS transistor P31 to disconnect the power supply bus line VDD_BL and the boost bus line BST_BL since the voltage of the trigger bus line TRG_BL is at a high state.

The discharge unit 320 includes an NMOS transistor N31 that is triggered by the voltage of the trigger bus line TRG_BL and discharges electrostaticity transferred to the power supply voltage bus line VDD_BL to the ground voltage bus line VSS_BL.

One terminal of the NMOS transistor N31 is connected to the power supply voltage bus line VDD_BL, the other terminal of the NMOS transistor N31 is connected to the ground voltage bus line VSS_BL, and the gate of the NMOS transistor N31 is connected to the trigger bus line TRG_BL.

The clamp unit 330 includes a resistor R32 and clamps 332 and 334.

One terminal of the resistor R32 is connected to the input/output pad 300 and the other terminal of the resistor R32 is connected to the input terminal of the input buffer 300 to drop electrostaticity passed from the input/output pad 300 and transferred to the input buffer 340.

The clamp 332 includes an NMOS transistor N33 included between the power supply voltage bus line VDD_BL and the input terminal of the input buffer 340. The NMOS transistor N33 is triggered by the voltage of the trigger bus line TRG_BL applied to the gate of the NMOS transistor N33 to discharge electrostaticity to the power supply voltage bus line VDD_BL before breaking the gate, of the PMOS transistor P32 constituting the input buffer 340, by electrostaticity passed from the input pad 300. As a result NMOS transistor N33 protects the gate of the PMOS transistor P32 of the input buffer 340.

Similarly to this, the clamp 334 includes an NMOS transistor N34 included between the ground voltage bus line VSS_BL and the input terminal of the input buffer 340. The NMOS transistor N34 is triggered by the voltage of the trigger bus line TRG_BL applied to the gate of the NMOS transistor N34 to discharge electrostaticity to the power supply voltage bus line VSS_BL before breaking the gate, of the NMOS transistor N32 constituting the input buffer 340, by electrostaticity passed from the input pad 300. As a result NMOS transistor 34 protects the gate of the PMOS transistor N32 of the input buffer 340.

FIG. 3 shows the NMOS transistors N33 and N34 triggered by the connection of the gates of the clamps 332 and 334 to the trigger bus line TRG_BL, but the present invention is not limited thereto and may apply various devices triggered by the trigger voltage applied from the trigger unit 310.

Hereinafter, the operation of the electrostatic discharge protective circuit according to the first embodiment of the present invention will be described with reference to FIG. 3.

When a positive potential electrostatic signal is generated at least one input/output pad 300 from a ground voltage terminal 304, the transfer unit 306 induces the electrostatic current to a power supply voltage bus line VDD_BL and at the same time, the transfer unit 309 induces the electrostatic current to the boost bus line BST_BL.

The trigger unit 310 responds to the alternating current flowed to the boost bus line BST_BL from the detector 312 to form a current path between the boost bus line BST_BL and the ground power supply bus line VSS_BL, thereby applying an output trigger voltage via the trigger bus line TRG_BL to the plurality of discharge units 320 and the plurality of clamp units 330.

Specifically, the detector 312 responds to the rapid signal rising time characteristic of the electrostatic current induced to the boost bus line BST_BL to invert the voltage drop via the buffer 314 generated from the resistor R31, thereby applying the voltage of the boost bus line BST_BL to the trigger bus line TRG_BL. Accordingly, the trigger bus line TRG_BL becomes a high state. The switch unit 316 responds to the voltage of the trigger bus line TRG_BL to turn off the PMOS transistor P31, thereby disconnecting the power supply voltage bus line VDD_BL and the boost bus line BST_BL.

At least one discharge unit 320 is triggered by the voltage of the trigger bus line TRG_BL to turn on the NMOS transistor N31, thereby discharging the electrostaticity transferred to the power supply voltage bus line VDD_BL by the transfer unit 306 to the ground voltage bus line VSS_BL.

The clamp unit 330 triggers the clamps 332 and 334 by the trigger bus line TRG_BL voltage to discharge the electrostaticity passed from the input buffer 340 to the power supply bus line VDD_BL and the ground voltage bus line VSS_BL, thereby safely protecting the gates of the PMOS transistor P32 and the NMOS transistor N32 constituting the input buffer 340 from the electrostaticity.

Figure 4:
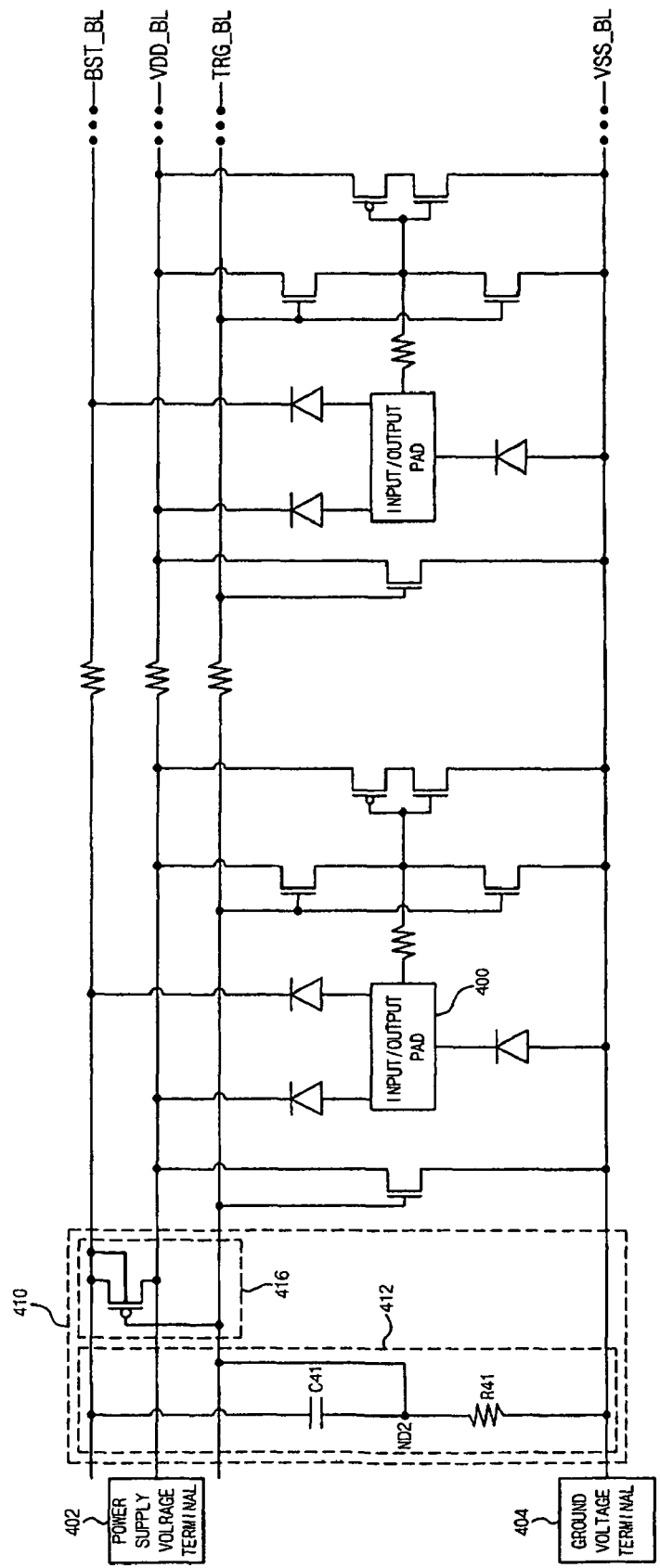
FIG. 4 is a circuit diagram showing one example of a trigger unit of FIG. 3.

Meanwhile, the trigger unit of the electrostatic discharge protective circuit according to the first embodiment of the present invention may be structured as in FIG. 4.

Referring to FIG. 4, the trigger unit 410 includes a detector 412 and a switch unit 416. Herein, the switch unit 416 has the same constitution and operation as the switch unit 316 of FIG. 3.

On the other hand, unlike the detector 312 of FIG. 3, the detector 412 may include a capacitor C41 and a resistor R41. Specifically, the capacitor C41 is connected between the boost bus line BST_BL and a node ND2, the resistor R41 is connected between the ND2 and the ground voltage bus VSS_BL, and the node ND2 is connected to the trigger bus line TRG_BL.

Therefore, when the positive electrostatic signal is generated to an input/output pad 400, the current path to the ground voltage bus line VSS_BL including the capacitor C41 and the resistor R41 is formed in response to the alternating current and the voltage drop generated across the resistor R41. A relatively higher bias voltage as compared to the voltage of the ground voltage bus line VSS_BL is detected at the node ND2 and is applied to the trigger bus line TRG_BL. Preferably, the voltage level of the bias voltage is similar to the voltage level of the boost bus line BST_BL.

Figure 5:
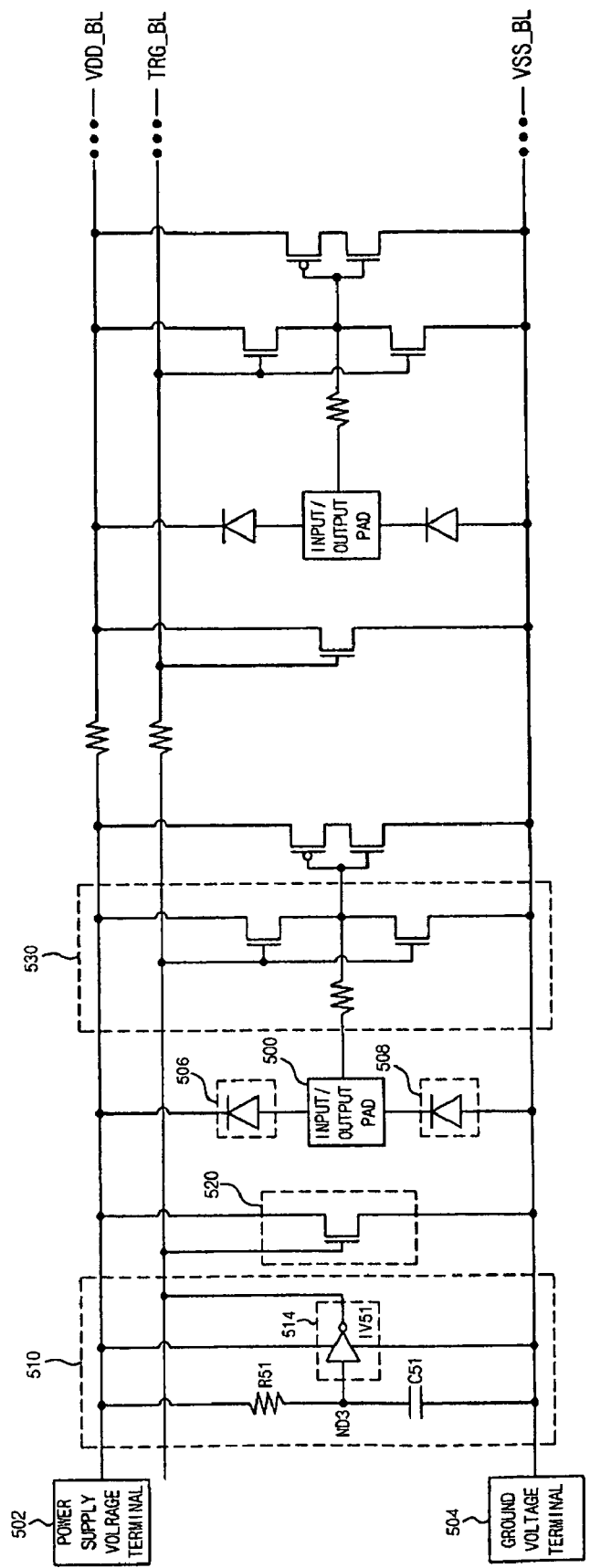
FIG. 5 is a circuit diagram showing an electrostatic discharge protective circuit according to a second embodiment of the present invention.

As shown in FIG. 5, the electrostatic discharge protective circuit according to a second embodiment of the present invention includes transfer units 506 and 508 that have a one-to-one corresponding relationship to each input/output pad 500, a discharge unit 520, and a clamp unit 530 and trigger units 510 that correspond to at least two input/output pads 500.

The transfer units 506 and 508, the discharge unit 520, and the clamp unit 530 have the same constitution and operation as the transfer units 306 and 308, the discharge unit 320, and the clamp unit 330 of the first embodiment (see FIG. 3).

On the other hand, the trigger unit 510 includes a resistor R51, a capacitor C51, and a buffer 514. The trigger unit 510 responds to the alternating current of electrostaticity transferred to the power supply voltage bus line VDD_BL by the transfer unit 506 to form the current path between the power supply voltage bus line VDD_BL and the ground voltage bus line VSS_BL, thereby detecting the generated voltage drop and transferring it to the trigger bus line TRG_BL.

Specifically, the resistor R51 is connected between the power supply voltage bus line VDD_BL and a node ND3, capacitor C51 the is connected between the ND3 and the ground voltage bus line VSS_BL, and the buffer 514 is connected between the node ND3 and the trigger bus line TRG_BL. The buffer 514 may include an inverter IV51.

In other words, the electrostatic discharge protective circuit according to the second embodiment uses the power voltage bus line VDD_BL as the electrostatic discharge path and the sensing path so that the boost bus line BST_BL of the electrostatic discharge protective circuit (see FIG. 3) according to the first embodiment of the present invention and the devices associated with (for example, transfer unit 309 and switch unit 316) and connected to the boost bus line BST_BL are not installed, thereby simplifying a circuit and reducing a required area.

As described above, the electrostatic discharge protective circuit according to the first and second embodiments includes one trigger unit for at least every two input/output pads to improve the area of the electrostatic discharge protective circuit. The plurality of discharge units and the plurality of clamp units are triggered by the voltage detected in the trigger unit to lower the operating voltage of the electrostatic discharge protective circuit, thereby safely protecting the input buffer from electrostaticity flowed to the input/output pad.

In particular, the electrostatic discharge protective circuit may be implemented by only the addition of a wiring connecting the trigger bus line TRG_BL and the clamp so that the thin gate insulating film in the internal circuit can be safely protected from the electrostaticity by greatly improving the performance of the electrostaticity discharge protective circuit over the related art without requiring additional costs.

Therefore, the present invention has the effect that one trigger unit for at least every two input/output pads is provided and that a plurality of clamps are triggered by the trigger unit, thereby providing that the electrostatic discharge protective circuit can safely protect the internal circuit from electrostatic damage without increasing the area of the electrostaticity protective circuit within the semiconductor integrated circuit.

The present invention also has the effect that the electrostatic protective circuit connects the trigger unit and the clamp unit via a common wiring, thereby lowering the operating voltage of the clamp unit at minimum costs.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An electrostatic discharge protective circuit comprising:
    a transfer unit that transfers electrostaticity from at least one of a plurality of input/output pads to a boost bus line;
    a trigger unit that responds to the electrostaticity transferred via the boost bus line from at least one of the plurality of input/output pads to detect a trigger voltage and apply it to a trigger bus line; and
    a plurality of clamp units that are connected between the plurality of input/output pads and an internal circuit and are triggered by the trigger voltage to discharge the electrostaticity of the input/output pads to a first or second voltage bus line, wherein each of the clamp units includes:
  a first clamp that responds to the trigger voltage applied to the trigger bus line to discharge the electrostaticity of the input/output pad to the first voltage bus line; and
  a second clamp that responds to the trigger voltage applied to the trigger bus line to discharge the electrostaticity of the input/output pad to the second voltage bus line.

2. The electrostatic discharge protective circuit as set forth in claim 1, wherein a transfer unit is provided for at least every one input/output pad.

3. The electrostatic discharge protective circuit as set forth in claim 2, wherein the transfer unit includes a diode whose anode is connected to the input/output pad and cathode is connected to the boost bus line.

4. The electrostatic discharge protective circuit as set forth in claim 1, wherein the first voltage bus line is a power supply voltage bus line and the second voltage bus line is a ground voltage bus line.

5. The electrostatic discharge protective circuit as set forth in claim 1, wherein the trigger unit includes:
  a detector unit that responds to alternating current of the electrostaticity to detect the trigger voltage by a dropped electrostatic voltage; and
  a switch unit that senses the trigger voltage transferred to the trigger bus line to disconnect the boost bus line and the first voltage bus line.

6. The electrostatic discharge protective circuit as set forth in claim 5, wherein the detector includes a resistor and a capacitor serially connected between the boost bus line and the second voltage bus line and wherein the trigger voltage is generated at a node connecting the resistor and the capacitor.

7. The electrostatic discharge protective circuit as set forth in claim 6, wherein the detector further comprises:
  a buffer that performs any one of a pull up operation or a pull down operation according to a state of the node connecting the resistor and the capacitor so as to output the trigger voltage to the trigger bus line.

8. The electrostatic discharge protective circuit as set forth in claim 7, wherein the buffer comprises:
  a pull up unit that responds to the state of the node connecting the resistor and the capacitor to pull up the trigger voltage to a voltage level of the boost bus line; and
  a pull down unit that responds to the state of the node connecting the resistor and the capacitor to pull down the trigger voltage to the voltage level of the ground voltage bus line.

9. The electrostatic discharge protective circuit as set forth in claim 5, wherein the switch unit includes a PMOS transistor that responds to the trigger voltage to disconnect the boost bus line and the first voltage bus line.

10. The electrostatic discharge protective circuit as set forth in claim 1, wherein each of the plurality of clamp units is provided for at least every one input/output pad.

11. The electrostatic discharge protective circuit as set forth in claim 1, wherein each of the first and second clamps includes an NMOS transistor whose gate is connected to the trigger bus line and one terminal of which is connected to the internal circuit.

* * * * *